United States Patent [19]

Vogel

[11] Patent Number: 4,614,227
[45] Date of Patent: Sep. 30, 1986

[54] COOLING BODY FOR THE LIQUID COOLING OF HIGH-POWER SEMICONDUCTOR COMPONENTS

[75] Inventor: Xaver Vogel, Turgi, Switzerland

[73] Assignee: BBC Brown, Boveri & Company Limited, Baden, Switzerland

[21] Appl. No.: 660,974

[22] Filed: Oct. 15, 1984

[30] Foreign Application Priority Data

Nov. 2, 1983 [CH] Switzerland .................. 5919/83
Nov. 8, 1983 [CH] Switzerland .................. 6013/83

[51] Int. Cl.⁴ ............................................. F28F 3/12
[52] U.S. Cl. .................................. 165/80.4; 357/82; 361/385
[58] Field of Search ............. 165/80 C; 357/82; 361/385

[56] References Cited

U.S. PATENT DOCUMENTS

| | | | |
|---|---|---|---|
| 2,440,245 | 4/1948 | Chevigny | 165/80 C |
| 3,405,323 | 10/1968 | Surty et al. | 361/385 X |
| 4,126,879 | 11/1978 | Kessler, Jr. et al. | 165/80 C X |
| 4,188,996 | 2/1980 | Pellant et al. | 361/385 X |

FOREIGN PATENT DOCUMENTS

| | | | |
|---|---|---|---|
| 98849 | 7/1980 | Japan | 357/82 |
| 6606526 | 11/1966 | Netherlands | 357/82 |

Primary Examiner—Albert W. Davis, Jr.
Assistant Examiner—Peggy A. Neils
Attorney, Agent, or Firm—Oblon, Fisher, Spivak, McClelland & Maier

[57] ABSTRACT

In a cooling body (1) which has, in the semiconductor supporting surfaces illustrated, cooling slits (3) which are connected via two connecting channels (4) to a collecting channel (7) for the supply of a cooling liquid, for example oil, cooling elements (9) are provided at the edge to improve the cooling effect. These cooling elements can be designed as cooling ribs, cooling fingers or cooling needles. The cooling liquid flows out of the cooling slits (3) at an angle ($\alpha$) of preferably 60° to 70°, so that it flows over a relatively long distance along the outer edge of the cooling body (1) and between the cooling elements (9) of the latter and thereby dissipates heat from the cooling body and from the cooling elements. The cooling slits can extend radially, widening outwards, or in serpentine or involute form or spirally and can have a rectangular or triangular or semi-circular or trapezoidal cross-section.

33 Claims, 4 Drawing Figures

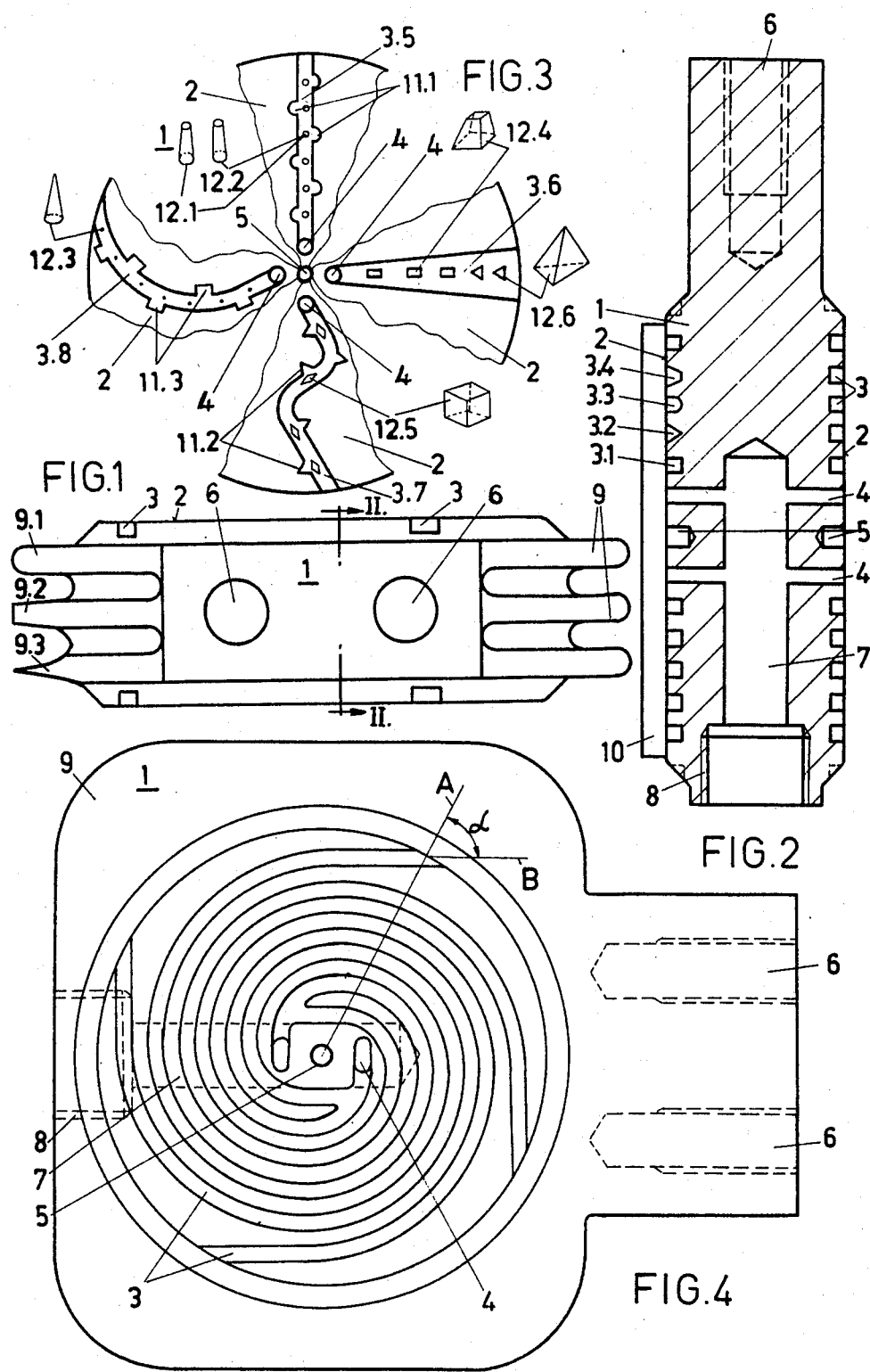

COOLING BODY FOR THE LIQUID COOLING OF HIGH-POWER SEMICONDUCTOR COMPONENTS

FIELD OF THE INVENTION

The invention is a cooling body for the liquid cooling of high-power semiconductor components.

BACKGROUND OF THE INVENTION

German Offenlegungsschrift No. 2,402,606 describes a cooling body for disc-shaped semiconductors in which a cooling liquid flows through an axial bore of large diameter, via narrower connecting channels, into wafer-shaped recesses which lead up to the closing bottom of the semiconductor component and thus allow the latter to be cooled directly. From there, the cooling liquid flows through an annular channel located at the edge and an outlet bore radially outwards into a space surrounding the cooling body.

OBJECT OF THE INVENTION

The subject invention achieves the object of designing a cooling body so that the cooling effect of the cooling liquid is improved, whilst ensuring that the constructive design will be as simple as possible.

GENERAL DESCRIPTION OF THE INVENTION

An advantage of the invention is that a better cooled semiconductor can be subjected to a higher electrical load that is to say, higher conducting-state currents can be achieved. By means of enlarged heat-exchange surfaces on the outer periphery, located at the edge of the cooling body in the form of cooling ribs, cooling fingers, etc., significantly more heat can be dissipated per unit time than without this measure.

According to an advantageous design of the invention, the cooling effect can be improved by means of a directional and intensified flow round the cooling ribs of the cooling body. In this case, the cooling liquid flows with a tangential component out of the cooling slits into the surrounding space and thereby dissipates additional heat from the cooling body. In this way, as regards oil cooling, it was possible to reduce the thermal resistance to one third in comparison to a cooling body in which there were no cooling ribs, cooling fingers, etc., and no intensified circular flow, but only the semiconductor supporting surface was cooled with cooling liquid.

It is advantageous to design the cooling slits with a rectangular profile. This profile is very simple to produce. According to a further development of the subject of the invention, the cooling slits are designed with a profile differing from the rectangular form, for example triangular, with a semi-circular arc or trapezoidal.

Consequently, the profile of the cooling slits can be adapted to satisfy the particular requirements in practically any way.

A serpentine or involute form of the cooling slits is particularly appropriate when the cooling slits differ from a position in which they are parallel to one another for example, if they are arranged radially. The radial arrangement of the cooling slits is suitable for a cylindrical form of the cooling body, and of course the diameter of the cylindrical cooling body matches the diameter of the surface to be cooled.

In a spiral design of the cooling slits, the cooling liquid is in contact with the cooling element over a relatively long distance, so that particularly effective cooling is achieved. Because the cooling liquid flows out at an angle to the radial direction, the turbulence of the cooling liquid is intensified in the vicinity of the cooling body, thus ensuring improved cooling.

A constant profile of the cooling slits is sufficient for a normal mode of operation. In some cases, it is expedient to design the cooling slits with a widening profile. Because of the variation in the profile size, the flow speed of the cooling liquid is also varied.

A further improvement to the cooling effect can be achieved if a turbulence of the cooling liquid within the cooling slits is ensured by means of recesses at the edges of the cooling slits and/or by means of an arrangement of turbulence-creating baffles within the cooling slits.

BRIEF DESCRIPTION OF THE DRAWINGS

The invention is explained in more detail below with reference to some examples illustrated diagrammatically. In the drawings:

FIG. 1 shows an end view of a disc-shaped cooling body,

FIG. 2 shows a cooling body according to FIG. 1 in cross-section on the line II—II in FIG. 1, revealing the collecting channel for supplying the cooling liquid and a bore for the electrical connection, FIG. 3 shows a cylindrical cooling body in which four different alternative forms of the cooling slits are illustrated in 4 segments, and FIG. 4 shows a plan view of the contact surface of a cooling body according to FIGS. 1 and 2.

DETAILED DESCRIPTION OF THE PRESENTLY PREFERRED EMBODIMENTS

According to FIGS. 1 and 2, a disc-shaped cooling body 1 is provided with two semi-conductor supporting surfaces 2. Several parallel cooling slits 3 are made in each of these semiconductor supporting surfaces 2 and can have a rectangular profile 3.1 or a triangular profile 3.2 or a profile with a semi-circular bottom 3.3 or a trapezoidal profile 3.4. For the sake of simplicity, these various profiles are illustrated on one cooling body in FIG. 2; in practise, preferably, only one of these profiles is used on a cooling body.

The cooling slits 3 are each connected to a collecting channel 7 by means of two connecting channels 4. Centering holes are designated by reference numeral 5. The end of the collecting channel 7 is provided with a thread 8. A bore 6 serves for the electrical connection of the cooling body 1.

9 denotes cooling elements which can be designed as sheet-like cooling ribs 9.1 or as a row of individual cooling fingers 9.2 or as cooling needles 9.3. The cooling fingers 9.2 are bar-shaped or in the form of truncated pyramids and preferably have a rhombic or square cross-section, the diagonal being oriented transversely to the main flow direction of the cooling liquid. The cooling fingers 9.2 of adjacent rows are advantageously offset to one another, so that good turbulence of the cooling liquid flowing past them is obtained. It is important that the cooling elements 9 should have relatively large heat dissipation surfaces so that they can transfer the heat to be dissipated to the cooling liquid in an effective way. The cooling body with the cooling elements 9 consists of a metal of good thermal conductivity such as, for example, copper, aluminium or their alloys.

For the sake of simplicity, FIG. 2 indicates only one disc-shaped high-power semiconductor component 10 which is cooled directly via the semiconductor supporting surface 2 and via the cooling liquid which, during operation, flows through the cooling slits 3. From the cooling slits 3 which are located at the edge of the supporting surface 2 and which penetrate into the region of the chamfer, the cooling liquid flows freely into a cooling-liquid vessel (not shown). The cooling liquid is supplied to the collecting channel 7 under pressure. Several sub-assemblies to be cooled can be arranged next to one another or behind one another in the cooling-liquid vessel. In power electronics, these sub-assemblies consist, as a rule, of a sandwich-like sequence of cooling body, high-power semiconductor, cooling body, high-power semiconductor, cooling body, etc. The disc-shaped components of a sub-assembly are pressed against one another by means of a clamping device (not shown), so that good electrical and heat-conducting contact is obtained between them, such as is described and illustrated, for example, in German Offenlegungsschrift No. 2,903,771.

The plan view of FIG. 4 shows spirally arranged cooling slits 3, with cooling elements 9 and with two bores 6 for electrical connections, in a cooling body 1 according to FIGS. 1 and 2. The cooling slits 3 have, at the outer edge of the cooling body, a liquid outflow angle α in the range from 40° to 90°, preferably from 60° to 70°. α is measured between a radial axis A and a cooling slit axis B at the liquid outflow end. This ensures that the cooling liquid, preferably oil, flows between and past the cooling elements 9 at the outer edge of the cooling body 1 and dissipates heat from these cooling elements.

FIG. 3 shows four fragmentary embodiments of cylindrical cooling slits 3 in cooling bodies 1. In two cases, the cooling slits 3 are guided radially, and in a further two cases they are guided substantially radially. They are connected by means of connecting channels 6 to the collecting channel 7 (which is not shown in FIG. 3). As is evident, the liquid is guided into the centre of the cooling body 1, from which it then flows to the outer edge of the cooling body 1. One cooling slit 3.5 is made straight, a further cooling slit 3.6 has a cross-section widening outwards, one cooling slit 3.7 is made serpentine, and one cooling slit 3.8 has an involute form. The two last-mentioned cooling slits 3.7 and 3.8 are, of course, combined with further cooling slits of similar design, which are distributed uniformly over the semiconductor supporting surface 2.

To achieve better turbulence of the cooling liquid within the cooling slits and consequently a better transmission of heat from the cooling body 1 to the cooling liquid, the cooling slits 3.5 . . . 3.8 have at the slit edges bulges or recesses 11.1 . . . 11.3 which are arranged such that they are offset relative to one another. These recesses are preferably semi-circular (11.1), triangular (11.2), or rectangular (11.3).

A further improvement to the turbulence and the cooling effect is achieved if turbulence-creating elements or turbulence-creating baffles 12.1 . . . 12.6 project into the cooling slits 3. The turbulence-creating baffles are made preferably conical (12.1), cylindrical (12.2), needle-shaped (12.3), pyramidal (12.4), prism-shaped (12.5), or tetrahedral (12.6). FIG. 3 illustrates the different forms of the turbulence-creating baffles in perspective. The different turbulence-creating baffles and recesses can also be used in combination with one another in one cooling body 1.

It goes without saying that the subject of the invention is not restricted to what is illustrated in the drawings. Other profiles and forms of the cooling slits 3 can be used. The cooling body 1 can even be provided with the cooling slits 3 on one side only, if the cooling body 1 is intended for cooling only one semiconductor component. The cooling body 1 can also have other forms.

What is claimed is:

1. A cooling body for the liquid cooling of at least one high-power semiconductor component, said cooling body having:
    (a) at least one semi-conductor supporting surface;
    (b) a plurality of cooling elements located at the edge of said cooling body;
    (c) a collecting channel for cooling liquid formed in said cooling body, said collecting channel having an upstream end and a downstream end, the downstream end of said collecting channel being in fluid communication with said at least one supporting surface; and
    (d) at least one cooling slit formed in said semi-conductor supporting surface, said at least one cooling slit having an upstream end and a downstream end, the upstream end of said at least one cooling slit being in fluid communication with the downstream end of said collecting channel and the downstream end of said at least one cooling slit forming a free liquid outflow orifice adjacent said at least one semi-conductor supporting surface, the outflow angle (α) of the downstream end of said at least one cooling slit being in the range from 40° to 90°, said outflow angle (α) being the angle between a radial axis (A) in said at least one semi-conductor supporting surface and the axis of said at least one cooling slit at said free liquid outflow orifice.

2. A cooling body as claimed in claim 1, wherein said cooling elements are cooling ribs.

3. A cooling body as claimed in claim 1, wherein said at least one cooling slit has a rectangular profile.

4. A cooling body as claimed in claim 1, wherein said at least one cooling slit is made at least in portions serpentine.

5. A cooling body as claimed in claim 1, wherein said at least one cooling slit has a profile which widens outwards in a radial direction.

6. A cooling body as claimed in claim 1, wherein said at least one cooling slit has recesses at its edges.

7. A cooling body as claimed in claim 6, wherein said recesses are semi-circular.

8. A cooling body as claimed in claim 1, which is disc-shaped.

9. A cooling body as claimed in claim 1, wherein said plurality of cooling elements are cooling fingers.

10. A cooling body as claimed in claim 1, wherein said plurality of cooling elements are cooling needles.

11. A cooling body as claimed in claim 1 1, wherein said at least one cooling slit has a triangular profile.

12. A cooling body as claimed in claim 1, wherein said at least one cooling slit has a semi-circular profile.

13. A cooling body as claimed in claim 1, wherein said at least one cooling slit has a trapezoidal profile.

14. A cooling body as claimed in claim 1, wherein said at least one cooling slit is at least in portions involute.

15. A cooling body as claimed in claim 1, wherein said at least one cooling slit is at least in portions spiral.

16. A cooling body as claimed in claim 1, wherein said outflow angle ($\alpha$) is in the range of from 60° to 70°.

17. A cooling body as claimed in claim 1, wherein turbulence-creating baffles project into said at least one cooling slit, said turbulence-creating baffles being sized, shaped, and positioned to produce turbulence of the cooling liquid in said at least one cooling slit during use of said cooling body.

18. A cooling body as claimed in claim 17, wherein said turbulence-creating baffles are conical.

19. A cooling body as claimed in claim 6, wherein said recesses are triangular.

20. A cooling body as claimed in claim 6, wherein said recesses are rectangular.

21. A cooling body as claimed in claim 17, wherein said turbulence-creating baffles are cylindrical.

22. A cooling body as claimed in claim 17, wherein said turbulence-creating baffles are needle-shaped.

23. A cooling body as claimed in claim 17, wherein said turbulence-creating baffles are pyramidal.

24. A cooling body as claimed in claim 17, wherein said turbulence-creating baffles are prism-shaped.

25. A cooling body as claimed in claim 17, wherein said turbulence-creating baffles are tetrahedral.

26. A cooling body as claimed in claim 1, which is cylindrical.

27. A cooling body as claimed in claim 1, wherein said at least one cooling slit is sized, shaped, and positioned to enlarge the cooling area of the cooling device without significantly increasing the rate of heat flow per unit of area or greatly extending the heat flow paths.

28. A cooling body as claimed in claim 27, wherein said at least one cooling slit has recesses at its edges.

29. A cooling body as claimed in claim 27, wherein turbulence-creating baffles project into said at least one cooling slit, said turbulence-creating baffles being sized, shaped, and positioned to produce turbulence of the cooling liquid in said at least one cooling slit during use of said cooling body.

30. A cooling body as claimed in claim 27, wherein said at least one cooling slit has a profile which widens outwards in a radial direction.

31. A cooling body as claimed in claim 29, wherein said at least one cooling slit has a profile which widens outwards in a radial direction.

32. A cooling body as claimed in claim 27, wherein said outflow angle ($\alpha$) is in the range of from 60° to 70°.

33. A cooling body as claimed in claim 28, wherein said at least one cooling slit has a profile which widens outwards in a radial direction.

* * * * *